(12) United States Patent
Lee et al.

(10) Patent No.: US 7,888,982 B2
(45) Date of Patent: Feb. 15, 2011

(54) SEMICONDUCTOR MEMORY APPARATUS

(75) Inventors: Hyun Woo Lee, Gyeonggi-do (KR); Won Joo Yun, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/855,244

(22) Filed: Aug. 12, 2010

(65) Prior Publication Data

US 2010/0301911 A1 Dec. 2, 2010

Related U.S. Application Data

(63) Continuation of application No. 12/344,799, filed on Dec. 29, 2008, now Pat. No. 7,800,422.

(30) Foreign Application Priority Data

Nov. 10, 2008 (KR) ...................... 10-2008-0110892

(51) Int. Cl.
*H03L 7/06* (2006.01)
(52) U.S. Cl. ...................... 327/158; 327/149
(58) Field of Classification Search ............... 327/149, 327/158
See application file for complete search history.

(56) References Cited

U.S. PATENT DOCUMENTS

| | | | |
|---|---|---|---|
| 6,690,224 B1 * | 2/2004 | Moore ........................ 327/296 |
| 6,879,188 B2 * | 4/2005 | Miyazaki et al. ............. 327/105 |
| 6,967,536 B2 * | 11/2005 | Hayashida et al. .......... 331/1 A |
| 7,339,364 B2 * | 3/2008 | Kam et al. ............... 324/76.54 |
| 7,528,638 B2 * | 5/2009 | Lee et al. ..................... 327/158 |
| 7,800,422 B2 * | 9/2010 | Lee et al. ..................... 327/158 |
| 2004/0061558 A1 * | 4/2004 | Hayashida et al. ............ 331/11 |
| 2008/0116949 A1 * | 5/2008 | Nair ............................ 327/158 |

(Continued)

FOREIGN PATENT DOCUMENTS

JP 2004-086645 A 3/2004

(Continued)

OTHER PUBLICATIONS

USPTO-OA mailed Jan. 29, 2010 in connection with U.S. Appl. No. 12/344,799.

*Primary Examiner*—Lincoln Donovan
*Assistant Examiner*—Adam D Houston
(74) *Attorney, Agent, or Firm*—Ladas & Parry LLP

(57) ABSTRACT

A semiconductor memory apparatus having a clock signal generation circuit and a data output circuit is presented. The apparatus includes a delay locked loop (DLL), a phase locked loop (PLL), a frequency discrimination unit, and a data output buffer. The DLL circuit is configured to negatively delay a clock signal to generate a DLL clock signal. The PLL circuit is configured to receive the DLL clock signal to generate a control voltage in response to a frequency of the DLL clock signal and to generate a PLL clock signal of a frequency corresponding to a level of the control voltage. The frequency discrimination unit is configured to discriminate a frequency of the DLL clock signal in accordance with the level of the control voltage to generate a frequency discrimination signal. The data output buffer is configured to receive the DLL clock signal or the PLL clock signal to buffer output data signals.

16 Claims, 5 Drawing Sheets

U.S. PATENT DOCUMENTS

2009/0206895 A1* 8/2009 Yun et al. .................. 327/157
2010/0117695 A1* 5/2010 Lee et al. .................... 327/158

FOREIGN PATENT DOCUMENTS

| KR | 1020050032827 A | 4/2005 |
| KR | 1020050073932 A | 7/2005 |
| KR | 1020080051462 A | 6/2008 |

* cited by examiner

US 7,888,982 B2

SEMICONDUCTOR MEMORY APPARATUS

CROSS-REFERENCES TO RELATED APPLICATION

The present application claims priority under 35 U.S.C 119(a) to Korean Application No. 10-2008-0110892, filed on Nov. 10, 2008, in the Korean Intellectual Property Office, which is incorporated herein by reference in its entirety as if set forth in full.

BACKGROUND

1. Technical Field

The embodiment described herein relates to a semiconductor memory apparatus, and more particularly, to a clock signal generation circuit and a data output circuit of a semiconductor memory apparatus.

2. Related Art

A conventional semiconductor memory apparatus includes a clock signal generation circuit such as a delay locked loop (DLL) circuit or a phase locked loop (PLL) circuit. The semiconductor memory apparatus has improved an operational speed thereof by synchronizing output data by means of an internal clock signal generated from the clock signal generation circuit. The DLL circuit is configured to provide a negative delay to an external clock signal input through a clock input buffer, and thus, generate a clock signal having an advance phase for a predetermined time to transmit the clock signal to a data output circuit. Meanwhile, the PLL circuit is configured to discriminate a frequency and a phase of the input clock signal, and regenerate a clock signal corresponding to the frequency and the phase by means of an oscillator to transmit the clock signal to the data output circuit.

The DLL circuit has an advantage in that the DLL circuit has excellent adaptability to PVT (process, voltage, and temperature) in low-frequency operation and high stability to a jitter component. However, the DLL circuit has a disadvantage in that the DLL circuit is not suitable for a high-frequency operation. On the contrary, the PLL circuit is suitable for the high-frequency operation, but the stability of the PLL circuit deteriorates in the low-frequency operation. In recent years, because the semiconductor memory apparatus has gradually operated at higher speeds, the semiconductor memory apparatus has been installed in an environment using a high-frequency clock signal. Therefore, a lot of semiconductor memory apparatuses are designed to have the PLL circuit. Herein, the PLL circuit used for a data output operation has a negative delay circuit to control a phase of an output clock signal. Like this, in a case when the PLL circuit has the negative delay circuit, the PLL circuit has a disadvantage in that the performance thereof deteriorates.

The semiconductor memory apparatus that has only the DLL circuit or only a PLL circuit could only be adapted to a fixed frequency environment. A semiconductor memory apparatus that is adaptable to a wider frequency band by using selectively the DLL circuit or the PLL circuit has been developed in order to improve that, but even in this case, since the PLL circuit must have the negative circuit, excellent performance, which could not be secured. Consequently, the semiconductor memory apparatus had a problem in that the operational stability thereof deteriorates when performing a high-speed data output operation. As a result, the reliability of a data output operation cannot be largely secured.

SUMMARY

A semiconductor memory apparatus that can generate an internal clock signal having an excellent characteristic even in a high-frequency clock signal environment is disclosed herein.

Improving the reliability of a data output operation by performing the data output operation by means of a high-frequency clock signal having excellent stability is disclosed herein.

In one aspect, a semiconductor memory apparatus includes a delay locked loop (DLL) circuit configured to negatively delay a clock signal to generate a DLL clock signal; a phase locked loop (PLL) circuit configured to receive the DLL clock signal to generate a control voltage in response to a frequency of the DLL clock signal and to generate a PLL clock signal having a frequency corresponding to a level of the control voltage; a frequency discrimination unit configured to discriminate a frequency of the DLL clock signal in accordance with the level of the control voltage to generate a frequency discrimination signal; and a data output buffer configured to receive the DLL clock signal or to receive the PLL clock signal to buffer output data signals.

In another aspect, a semiconductor memory apparatus includes a delay locked loop (DLL) circuit configured to negatively delay a clock signal to generate a DLL clock signal; a phase locked loop (PLL) circuit configured to be activated or deactivated depending on whether or not a frequency discrimination signal is enabled and to generate a control voltage and a PLL clock signal in response to the DLL clock signal; a frequency discrimination unit configured to compare a level of the control voltage with a level of a reference voltage to enable or disable the frequency discrimination signal; and a clock selection unit configured to selectively output the DLL clock signal or the PLL clock signal as an internal clock signal in response to the frequency discrimination signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
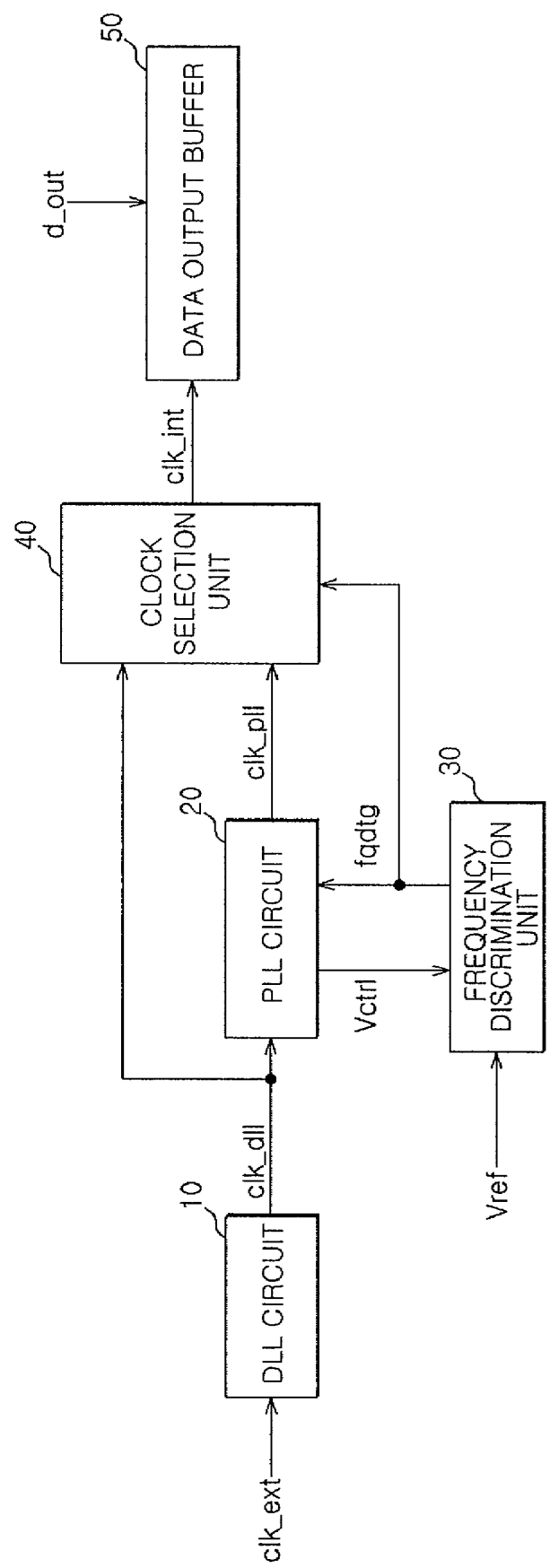
FIG. 1 is a block diagram illustrating a configuration of a semiconductor memory apparatus according to one embodiment of the invention.

FIG. 1 is a block diagram illustrating a configuration of a semiconductor memory apparatus according to one embodiment of the invention and schematically illustrates the configuration of a circuit that generates an internal clock signal and performs a data output operation.

As shown in FIG. 1, the semiconductor memory apparatus includes a DLL circuit, 10, a PLL circuit 20, a frequency discrimination unit 30, a clock selection unit 40, and a data output buffer 50.

The DLL circuit 10 can negatively delay an external clock signal 'clk_ext' to generate a DLL clock signal 'clk_dll'. The PLL circuit 20 can receive the DLL clock signal 'clk_dll', generate a control signal 'Vctrl' in response to a frequency of the DLL clock signal 'clk_dll', and generate a PLL clock signal 'clk_pll' having a frequency corresponding to a level of the control voltage 'Vctrl'. The frequency discrimination unit 30 can discriminate the frequency of the DLL clock signal 'clk_dll' in accordance with the level of the control voltage 'Vctrl' to generate a frequency discrimination signal 'fqdtg'. The clock selection unit 40 can selectively output the DLL clock signal 'clk_dll' or the PLL clock signal 'clk_pll' as an internal clock signal 'clk_int' in response to the frequency discrimination signal 'fqdtg'. The data output buffer 50 can receive the internal clock signal 'clk_int' to buffer output data signals 'd_out'.

Herein, the DLL circuit 10 is a general type DLL circuit that has a negative delay circuit used to generate the DLL clock signal earlier than the external clock signal 'clk_ext' by a predetermined time.

The PLL circuit 20 is configured to be activated only when the frequency discrimination signal 'fqdtq' is enabled. The PLL circuit 20 can perform a phase locking operation to the DLL clock signal 'clk_dll' to generate the PLL clock signal 'clk_pll' when the frequency discrimination signal 'fqdtg' is enabled. Accordingly, in this case, the PLL clock signal is implemented as a form of a clock signal that is periodically toggled, but the PLL clock signal 'clk_pll' becomes a meaningless signal having a low-level voltage when the frequency discrimination signal 'fqdtg' is disabled.

The frequency discrimination unit 30 can be implemented by a general type comparator circuit. The frequency discrimination unit 30 can receive the control voltage 'Vctrl' generated from the PLL circuit 20 and can generate the frequency discrimination signal 'fqdtg' by performing an operation for comparing a level of the control voltage 'Vctrl' with a level of a reference voltage 'Vref'. The control voltage 'Vctrl' increases the frequency of the PLL clock signal 'clk_pll' as the level of the control voltage 'Vctrl' is lower and decreases the frequency of the PLL clock signal 'clk_pll' as the level of the control voltage 'Vctrl' is raised.

Therefore, the frequency discrimination unit 30 enables the frequency discrimination signal 'fqdtg' when the level of the control voltage 'Vctrl' is lower than the level of the reference voltage 'Vref'. That is, the frequency discrimination unit 30 enables the frequency discrimination signal 'fqdtg' when the DLL clock signal 'clk_dll' has a comparatively higher frequency. In this case, as described above, the PLL circuit 20 can be activated. On the contrary, when the level of the control voltage 'Vref' is higher than the level of the reference voltage 'Vref', that is, when the DLL clock signal has a comparatively lower frequency, the frequency discrimination unit 30 disables the frequency discrimination signal 'fqdtg'. In this case, as described above, the PLL circuit 20 is not activated.

The clock selection unit 40 can output the PLL clock signal 'clk_pll' as the internal clock signal 'clk_int' when the frequency discrimination signal 'fqdtg' is enabled and can output the DLL clock signal 'clk_int' as the internal clock signal 'clk_int' when the frequency discrimination signal 'fqdtg' is disabled.

Consequently, when the frequency of the DLL clock signal 'clk_dll' exceeds a reference frequency, the PLL circuit 20 is activated and the PLL clock signal 'clk_pll' is output as the internal clock signal 'clk_int'. On the contrary, when the frequency of the DLL clock signal 'clk_dll' is lower than the reference frequency, the PLL circuit 20 is not activated and the DLL clock signal 'clk_dll' is output as the internal clock signal 'clk_int'.

The data output buffer 50 performs a buffering operation with respect to the output data signals 'd_out' by using the internal clock signal 'clk_int' generated through the above-mentioned process.

As described above, the semiconductor memory apparatus generates the internal clock signal 'clk_int' used for buffering the output data signals 'd_out' in the data output buffer 50 by selectively using the DLL clock signal 'clk_dll' or the PLL clock signal 'clk_pll' in accordance with the frequency of the DLL clock signal 'clk_dll'. Accordingly, the internal clock signal 'clk_int' can be implemented as a clock signal having an excellent characteristic regardless of a frequency environment. Moreover, the PLL circuit 20 does not have the negative delay circuit therein and since the PLL circuit 20 can receive the DLL clock signal 'clk_dll' generated through the negative delay circuit inside of the DLL circuit 10 to generate the PLL clock signal 'clk_pll', the PLL circuit 20 can generate the PLL clock signal 'clk_pll' having a better characteristic. Further, since the PLL circuit 20 is not activated in a low-frequency operation, it is possible to suppress an increase in current consumption by being provided with the DLL circuit 10 and the PLL circuit 20 at once.

Figure 2:
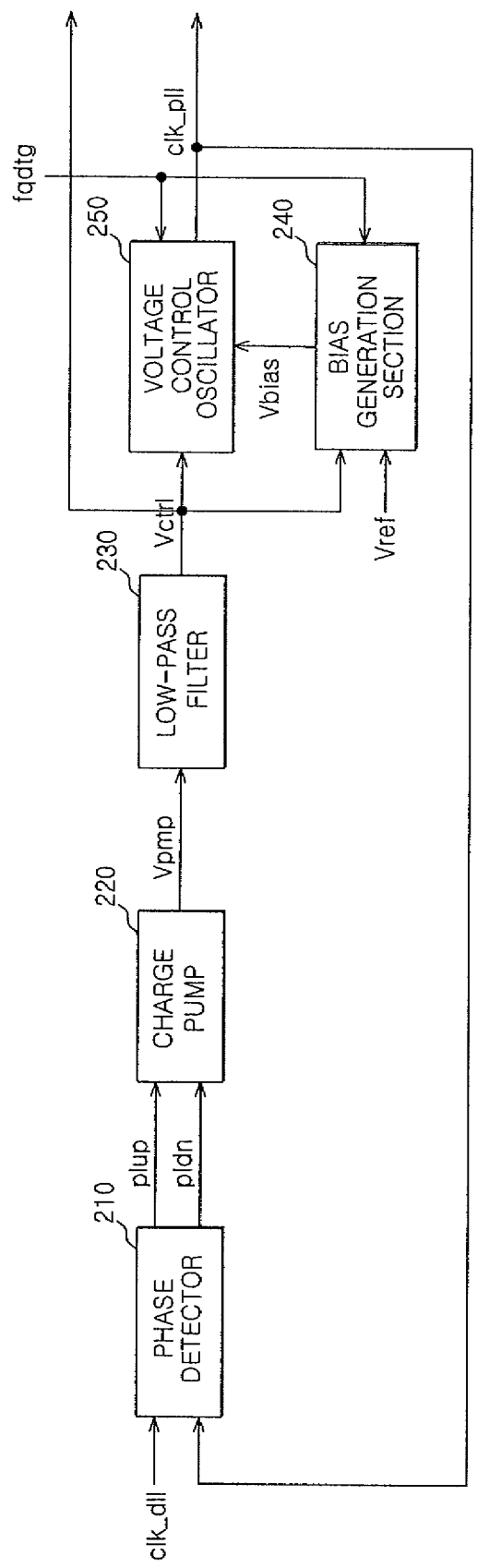
FIG. 2 is a block diagram illustrating a configuration of a PLL circuit shown in FIG. 1.

FIG. 2 is a block diagram illustrating a configuration of a PLL circuit shown in FIG. 1.

As shown in FIG. 2, the PLL circuit 20 includes a phase detector 210, a charge pump 220, a low-pass filter 230, a bias generation section 240, and a voltage control oscillator 250.

The phase detector 210 can compare a phase of the DLL clock signal 'clk_dll' with a phase of the PLL clock signal to generate a pull-up control signal 'plup' and a pull-down control signal 'pldn'. The charge pump 220 can generate a pumping voltage 'Vpmp' by performing a voltage pumping operation in response to the pull-up control signal 'plup' and the pull-down control signal 'pldn'. The low-pass filter 230 can filter the pumping voltage 'Vpmp' to generate the control voltage 'Vctrl'. The bias generation section 240 can generate a bias voltage 'Vbias' in response to the frequency discrimination signal 'fqdtg', the control voltage 'Vctrl', and the reference voltage 'Vref'. The voltage control oscillator 250 can oscillate the PLL clock signal 'clk_pll' in response to the frequency discrimination signal 'fqdtg', the control voltage and the bias voltage 'Vbias'.

The bias generation section 240 can receive the reference voltage 'Vref' and generate the bias voltage 'Vbias' in response to the control voltage 'Vctrl'. The bias voltage 'Vbias' can maintain a predetermined level even when the level of the control voltage 'Vctrl' varies by a predetermined level, and thus the bias voltage can support a stable operation of the voltage control oscillator 250.

The level of the control voltage 'Vctrl' successively varies depending on the frequency of the DLL clock signal 'clk_dll' input into the phase detector 210. That is, as the frequency of the DLL clock signal 'clk_dll' is raised, the level of the control voltage 'Vctrl' decreases and as the frequency of the DLL clock signal 'clk_dll' is lowered, the level of the control voltage 'Vctrl' increases. The voltage control oscillator 250 is activated only when the frequency discrimination signal 'fqdtg' is enabled and generates the PLL clock signal 'clk_pll' having a frequency corresponding to the level of the control voltage 'Vctrl'.

The voltage control oscillator 250 is configured to have a plurality of delay cells. Each of the delay cells can be configured in the form of a differential amplifier. Herein, each of the delay cells is configured to be deactivated by blocking an internal current path when the frequency discrimination signal 'fqdtg' is disabled. As a result, when the PLL clock signal 'clk_pll' is not utilized, the voltage control oscillator 250 can prevent unnecessary current from flowing.

Figure 3:
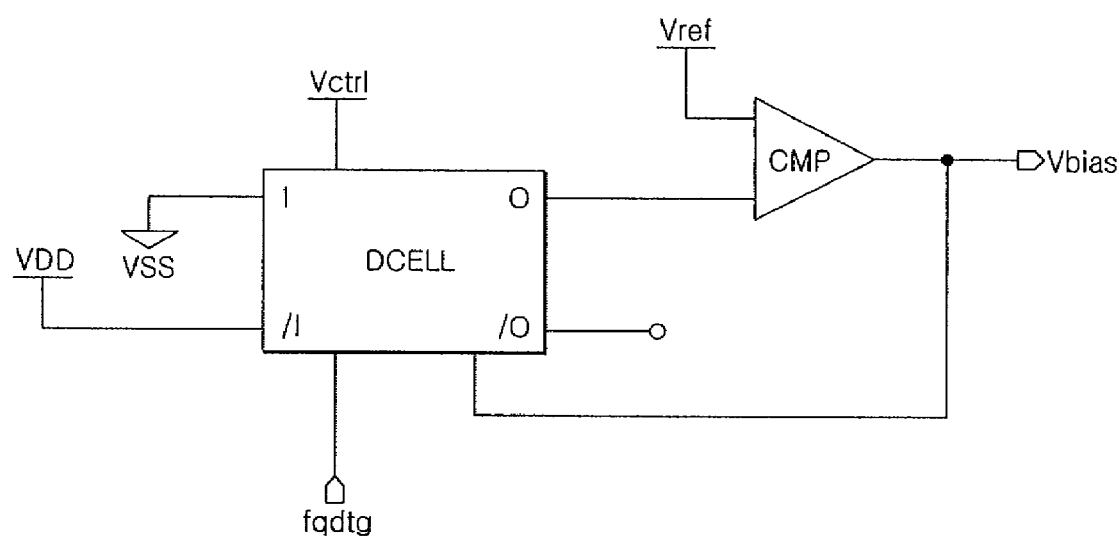
FIG. 3 is a detailed configuration diagram illustrating a bias generation section shown in FIG. 2.

FIG. 3 is a detailed configuration diagram illustrating a bias generation section shown in FIG. 2.

As shown in FIG. 3, the bias generation section 240 includes a delay cell DCELL and a comparator CMP.

The delay cell DCELL includes a positive input terminal 'I' to which a ground voltage VSS is applied and includes a negative input terminal '/I' to which an external supply voltage VDD is applied. The delay cell DCELL can perform a delaying operation in response to the control voltage 'Vctrl', to the frequency discrimination signal 'fqdtg', and to the bias voltage 'Vbias' and outputs an output signal through a positive output terminal 'O'. The comparator CMP can generate the bias voltage 'Vbias' by comparing a level of the reference voltage 'Vref' with a level of the output signal of the delay cell DCELL.

The delay cell DCELL provided in the bias generation section 240 has the same configuration as the delay cells provided in the voltage control oscillator 250 as described below. A voltage level of the signal output from the delay cell DCELL may vary as the variation of the level of the control voltage 'Vctrl'. However, the level of the bias 'Vbias' output from the comparator CMP can be constantly maintained by setting a minimum level of the output signal to a level higher than the level of the reference voltage 'Vref' when the delay cell DCELL operates normally.

Figure 4:
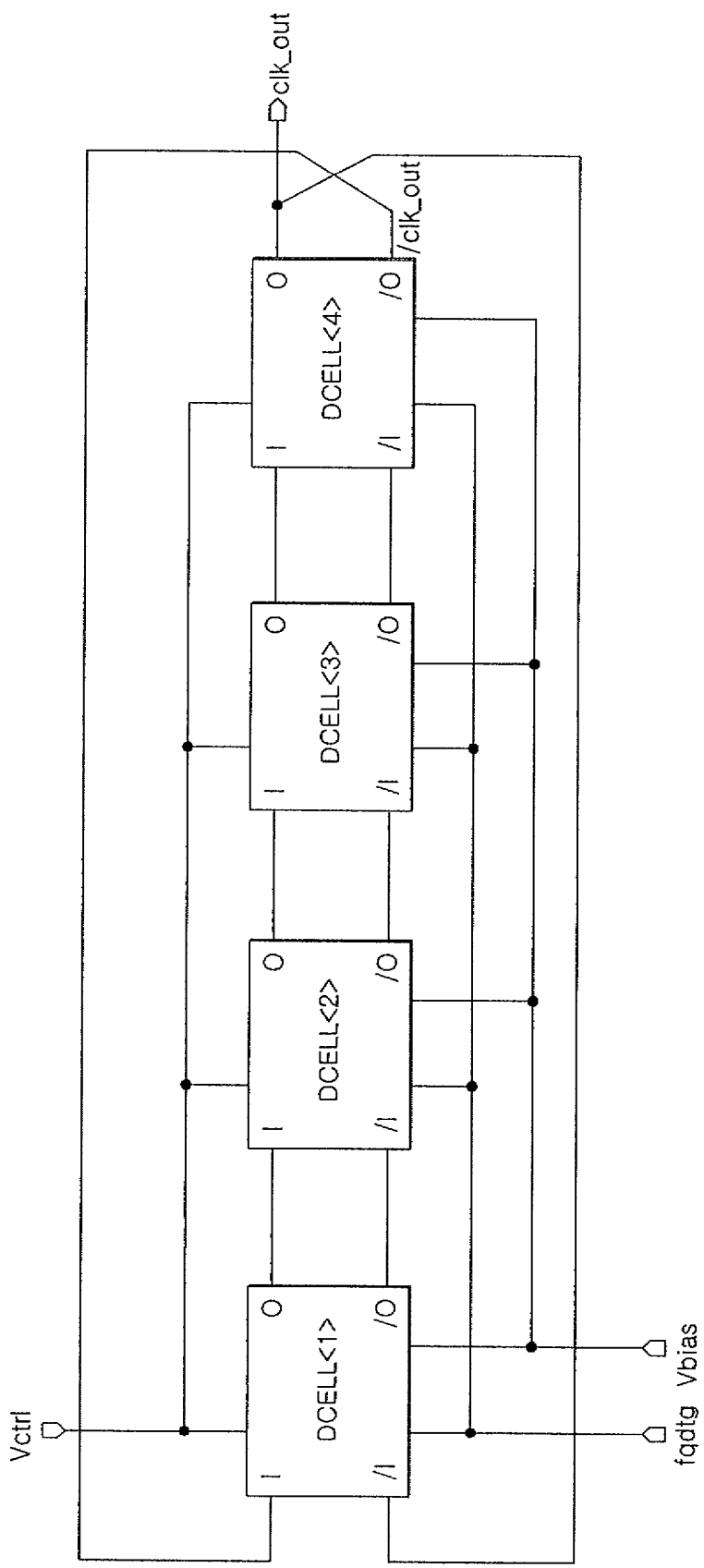
FIG. 4 is a detailed configuration diagram illustrating a voltage control oscillator shown in FIG. 2.

FIG. 4 is a detailed configuration diagram illustrating a voltage control oscillator shown in FIG. 2.

As shown in FIG. 4, the voltage control oscillator 250 includes first to fourth delay cells DCELL<1:4> that transmit to the subsequent delay cell a pair of output signals generated by delaying a pair of output signals of the previous delay cell in response to the frequency discrimination signal 'fqdtg', the control voltage 'Vctrl', and the bias voltage 'Vbias'.

Herein, input and output clock signals of the first to fourth delay cells DCELL<1:4> can be implemented in the form of a pair of clock signals. Herein, the first delay cell DCELL<1> receives clock-pair type PLL clock signals 'clk_pll' and '/clk_pll' as an input signal thereof. A negative PLL clock signal 'clk_pll' is input through the positive input terminal 'I' and a positive PLL clock signal 'clk_pll' is input through the negative input terminal '/I'.

When the frequency discrimination signal 'fqdtg' is enabled, the voltage control oscillator 250 starts an oscillation operation and thus the PLL clock signal 'clk_pll' is toggled. At this time, the PLL clock signal 'clk_pll' has the frequency corresponding to the level of the control voltage 'Vctrl' and when the level of the control voltage 'Vctrl' varies, the frequency of the PLL clock signal 'clk_pll' also varies in correspondence therewith.

Figure 5:
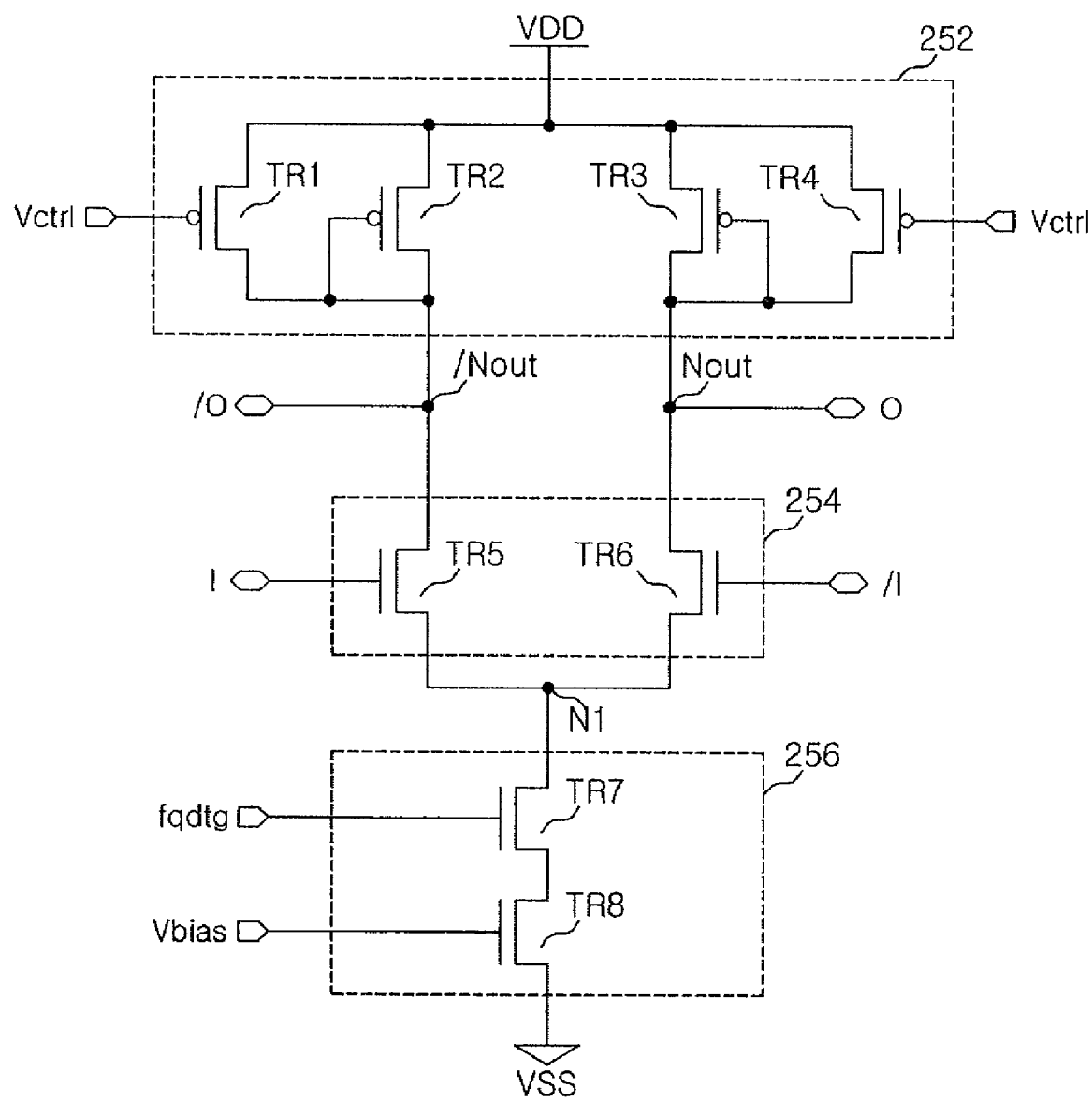
FIG. 5 is a detailed configuration diagram illustrating a delay cell shown in FIG. 4.

FIG. 5 is a detailed configuration diagram illustrating a delay cell shown in FIG. 4. Since all four delay cells DCELL<1:4> are configured in the same pattern, any one DCELL<i> among them is described as an example.

As shown in FIG. 5, the delay cell DCELL<i> includes a pair of input terminals 'I' and '/I', a pair of output terminals 'O' and 'O', a pair of output nodes 'Nout' and '/Nout', a first node 'N1', a frequency control section 252, an input section 254, and an operation control section 256.

The pair of output nodes 'Nout' and '/Nout' are connected to the pair of output terminals 'O' and '/O', respectively.

The frequency control section 252 controls frequencies of signals applied to the pair of output nodes 'Nout' and '/Nout' in response to the control voltage 'Vctrl'. The frequency control section 252 includes a first transistor TR1, a second transistor TR2, a third transistor TR3, and a fourth transistor TR4.

The first transistor TR1 can include a gate applied with the control voltage 'Vctrl', a source applied with the external supply voltage VDD, and a drain coupled with the negative output node '/Nout'. The second transistor TR2 can include a gate and a drain coupled with the negative output node '/Nout', and a source applied with the external supply voltage VDD. The third transistor TR3 can include a gate and a drain coupled with the positive output node 'Nout', and a source applied with the external supply voltage VDD. The fourth transistor TR4 can include a gate applied with the control voltage 'Vctrl', a source applied with the external supply voltage VDD, and a drain coupled with the positive output node 'Nout'.

The input section 254 controls voltage levels of the pair of output nodes 'Nout' and '/Nout' in response to signals input through the pair of input terminals 'I' and '/I'. The input section 254 can include a fifth transistor TR5 and a sixth transistor TR6.

The fifth transistor TR5 can include a gate coupled with the positive input terminal 'I', a drain coupled with the negative output node '/Nout', and a source coupled with the first node 'N1'. The sixth transistor TR6 can include a gate coupled with the negative input terminal '/I', a drain coupled with the positive output node 'Nout', and a source coupled with the first node 'N1'.

The operation control section 256 controls the operation or not of the frequency control section 252 and the input section 254. The operation control section 256 can include a seventh transistor TR7 and an eighth transistor TR8.

The seventh transistor TR7 can include a gate receiving the frequency discrimination signal 'fqdtg' and a drain coupled with the first node 'N1'. The eighth transistor TR8 can include a gate receiving the bias voltage 'Vbias', a drain coupled with the source of the seventh transistor TR7, and a source grounded.

The delay cell DCELL<i> can start to operate when the frequency discrimination signal 'fqdtg' input into the operation control section 256 is enabled. As described above, since the level of the bias voltage 'Vbias' input into the operation control section 256 is constantly maintained, then the delay cell DCELL<i> can be stably operated.

When a high-level signal is input into the positive input terminal 'I' of the input section 254 and a low-level signal is input into the negative input terminal '/I' of the input section 254, the positive output node 'Nout' has a high-level voltage and the negative output node '/Nout' has a low-level voltage. Similarly, when the low-level signal is input into the positive input terminal 'I' and the high-level signal is input into the negative input terminal '/I', the positive output node 'Nout' has the low-level voltage and the negative output node '/Nout/ has the high-level voltage.

Frequencies of a pair of signals output through the pair of output nodes 'Nout' and '/Nout' and the pair of output terminals 'O' and '/O' correspond to the level of the control voltage 'Vctrl'. That is, as the level of the control voltage 'Vctrl' is lower, the frequencies of the pair of output signals are increased; and as the level of the control voltage 'Vctrl' is raised, the frequencies of the pair of output signals are decreased.

As described above, a semiconductor memory apparatus can operate a data output buffer by selectively using a DLL clock signal or a PLL clock signal in response to a frequency of the DLL clock signal, thereby improving the stability of a data output operation. Accordingly, the reliability of a data output operation can be improved. In particular, since a PLL circuit operates by using a negative delay function of a DLL circuit without a negative delay circuit therein, the PLL circuit can further implement a characteristic of the PLL clock signal used in a high-frequency operation in an excellent manner. Further, since the PLL circuit is not activated in a low-frequency operation, it is possible to suppress an increase in current consumption by being provided with the DLL circuit and the PLL circuit at once.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A semiconductor apparatus, comprising:
   a delay locked loop (DLL) circuit configured to delay a clock signal to generate a DLL clock signal;
   a phase locked loop (PLL) circuit configured to receive the DLL clock signal to generate a PLL clock signal, wherein the activation of the PLL circuit is determined based on the DLL clock signal; and
   a data output buffer configured to buffer output data signals according to one of the DLL clock signal and the PLL clock signal.

2. The semiconductor apparatus according to claim 1, wherein the PLL circuit generates a control voltage corresponding to a frequency of the DLL clock signal.

3. The semiconductor apparatus according to claim 2, further comprising:
   a frequency discrimination unit configured to discriminate the frequency of the DLL clock signal according to a level of the control voltage to generate a frequency discrimination signal.

4. The semiconductor apparatus according to claim 3, wherein the activation of the PLL circuit is determined in response to the frequency discrimination signal.

5. The semiconductor apparatus according to claim 4, wherein the PLL circuit includes:
   a phase detector configured to compare a phase of the DLL clock signal and a phase of the PLL clock signal to generate a pull-up control signal and a pull-down control signal;
   a charge pump configured to perform a voltage pumping operation in response to the pull-up control signal and the pull-down control signal to generate a pumping voltage;
   a low-pass filter configured to filter the pumping voltage to generate the control voltage;
   a bias generation section configured to generate a bias voltage in response to the frequency discrimination signal, the control voltage, and a reference voltage; and
   a voltage control oscillator configured to oscillate the PLL clock signal in response to the frequency discrimination signal, the control voltage, and the bias voltage.

6. The semiconductor apparatus according to claim 5, wherein the voltage control oscillator includes a plurality of delay cells configured to transmit to the subsequent delay cell a pair of output signals generated by delaying a pair of output signals of a previous delay cell in response to the frequency discrimination signal, the control voltage, and the bias voltage.

7. The semiconductor apparatus according to claim 4, wherein each of the plurality of delay cells includes:
   a pair of input terminals;
   a pair of output terminals;
   a pair of output nodes connected to the pair of output terminals;
   a frequency control section configured to control frequencies of signals applied to the pair of output nodes in response to the control voltage;
   an input section configured to control voltage levels of the pair of output nodes in response to signals input through the pair of input terminals; and
   an operation control section configured to control the operations of the frequency control section and the input section in response to the frequency discrimination signal and the bias voltage.

8. The semiconductor apparatus according to claim 3, wherein the frequency discrimination unit includes a comparator circuit to compare the level of the control voltage with a level of a reference voltage, and is configured to enable the frequency discrimination signal when a frequency of the DLL clock signal is higher than a predetermined frequency and configured to disable the frequency discrimination signal when a frequency of the DLL clock signal is lower than the predetermined frequency.

9. The semiconductor apparatus according to claim 3, further comprising:
   a clock selection unit configured to selectively transmit the DLL clock signal or the PLL clock signal to the data output buffer whether or not the frequency discrimination signal is enabled.

10. A semiconductor apparatus, comprising:
    a delay locked loop (DLL) circuit configured to negatively delay a clock signal to generate a DLL clock signal;
    a phase locked loop (PLL) circuit configured to receive the DLL clock signal to generate a control voltage in response to a frequency of the DLL clock signal and to generate a PLL clock signal having a frequency corresponding to a level of the control voltage;
    a frequency discrimination unit configured to discriminate a frequency of the DLL clock signal in accordance with the level of the control voltage to generate a frequency discrimination signal; and
    a data output buffer configured to buffer output data signals according to one of the DLL clock signal and the PLL clock signal.

11. The semiconductor apparatus according to claim 10, wherein the PLL circuit is configured to be activated when the frequency discrimination signal is enabled and deactivated when the frequency discrimination signal is disabled.

12. The semiconductor apparatus according to claim 11, wherein the PLL circuit includes:
    a phase detector configured to compare a phase of the DLL clock signal and a phase of the PLL clock signal to generate a pull-up control signal and a pull-down control signal;
    a charge pump configured to perform a voltage pumping operation in response to the pull-up control signal and the pull-down control signal to generate a pumping voltage;
    a low-pass filter configured to filter the pumping voltage to generate the control voltage;

a bias generation section configured to generate a bias voltage in response to the frequency discrimination signal, the control voltage, and a reference voltage; and a voltage control oscillator configured to oscillate the PLL clock signal in response to the frequency discrimination signal, the control voltage, and the bias voltage.

13. The semiconductor apparatus according to claim 12, wherein the voltage control oscillator includes a plurality of delay cells configured to transmit to the subsequent delay cell a pair of output signals generated by delaying a pair of output signals of a previous delay cell in response to the frequency discrimination signal, the control voltage, and the bias voltage.

14. The semiconductor apparatus according to claim 13, wherein each of the plurality of delay cells includes:

a pair of input terminals;

a pair of output terminals;

a pair of output nodes connected to the pair of output terminals;

a frequency control section configured to control frequencies of signals applied to the pair of output nodes in response to the control voltage;

an input section configured to control voltage levels of the pair of output nodes in response to signals input through the pair of input terminals; and an operation control section configured to control the operations of the frequency control section and the input section in response to the frequency discrimination signal and the bias voltage.

15. The semiconductor apparatus according to claim 10, wherein the frequency discrimination unit includes a comparator circuit to compare a level of the control voltage with a level of a reference voltage, and is configured to enable the frequency discrimination signal when a frequency of the DLL clock signal is higher than a predetermined frequency and configured to disable the frequency discrimination signal when a frequency of the DLL clock signal is lower than the predetermined frequency.

16. The semiconductor apparatus according to claim 10, further comprising:

a clock selection unit configured to selectively transmit the DLL clock signal or the PLL clock signal to the data output buffer whether or not the frequency discrimination signal is enabled.

* * * * *